United States Patent [19]

Kimura

[11] Patent Number: 5,114,865
[45] Date of Patent: May 19, 1992

[54] METHOD OF MANUFACTURING A SOLID-STATE IMAGE SENSING DEVICE HAVING AN OVERFLOW DRAIN STRUCTURE

[75] Inventor: Mikihiro Kimura, Hyogo, Japan

[73] Assignee: Mitsubishi Denki Kabushiki Kaisha, Tokyo, Japan

[21] Appl. No.: 731,232

[22] Filed: Jul. 17, 1991

Related U.S. Application Data

[62] Division of Ser. No. 505,387, Apr. 6, 1990, Pat. No. 5,051,798.

[30] Foreign Application Priority Data

Apr. 7, 1989 [JP] Japan .................................. 1-89341

[51] Int. Cl.$^5$ .................. H01L 31/18; H01L 21/339
[52] U.S. Cl. ........................................ 437/2; 437/27; 437/35; 437/53; 437/150
[58] Field of Search .................. 437/2, 27, 35, 36, 50, 437/53, 63, 64, 149, 150

[56] References Cited

U.S. PATENT DOCUMENTS

| 4,362,575 | 12/1982 | Wallace | 437/53 |
| 4,396,438 | 8/1983 | Goodman | 437/27 |
| 4,760,273 | 7/1988 | Kimata | 357/24 LR |
| 4,851,887 | 7/1989 | Hagiwara | 357/24 LR |

FOREIGN PATENT DOCUMENTS

| 51-22356 | 7/1976 | Japan . | |
| 51-24878 | 7/1976 | Japan | 357/24 LR |
| 59-105779 | 6/1984 | Japan . | |
| 61-170237 | 7/1986 | Japan . | |
| 0051254 | 3/1987 | Japan | 357/24 LR |
| 0227036 | 9/1988 | Japan | 437/35 |
| 0302553 | 12/1988 | Japan | 437/53 |

OTHER PUBLICATIONS

C. H. Sequin, "Blooming Suppression in Charge Coupled Area Imaging Devices", The Bell Systems Technical Journal, Oct. 1972, pp. 1923–1926.

Primary Examiner—Brian E. Hearn
Assistant Examiner—C. Chaudhari
Attorney, Agent, or Firm—Lowe, Price, LeBlanc & Becker

[57] ABSTRACT

A solid-state image sensing device has an overflow drain structure for purging superfluous charges. The overflow drain structure includes a gate electrode (34), channel regions (35), and a drain region (32) formed inside each groove (26) formed on a main surface of a semiconductor substrate (6). Optoelectro transducers (4) are formed on main surface regions of the semiconductor substrate continuous with each groove. The drain region is formed on side walls and a bottom wall of each groove by oblique ion implantation. The overflow drain structure formed inside the groove occupies a reduced area on the main surface of the semiconductor substrate and increases its opening ratio.

3 Claims, 14 Drawing Sheets

METHOD OF MANUFACTURING A SOLID-STATE IMAGE SENSING DEVICE HAVING AN OVERFLOW DRAIN STRUCTURE

This application is a division of application Ser. No. 07/505,387, now U.S. Pat. No. 5,051,798, filed Apr. 6, 1990.

BACKGROUND ART

1. Field of the Invention

This invention relates to solid-state image sensing devices and, more particularly, to the construction of a solid-state image sensing device having an overflow drain structure for checking the blooming phenomenon. Further, the invention relates to methods of manufacturing the overflow drain structure of the solid-state image sensing device.

2. Description of the Background Art

The solid-state image sensing device has three basic functions which are photoelectric conversion, charge storage and scanning. It is an image converting device which stores charges proportional to quantities of incident light in respective pixels arranged in a mosaic pattern, and reads out variations in the charges proportional to intensities of incident light by electrically switching these pixels in succession.

Solid-state image sensing devices are classified broadly into two types, i.e. the interline transfer type and frame transfer type. The construction of a conventional solid-state image sensing device of the interline transfer type will be described with reference to FIGS. 10 and 11. FIG. 10 is a plan view of the conventional solid-state image sensing device. FIG. 11 is a section taken on line A—A of FIG. 10. A solid-state image sensing device having the illustrated construction is disclosed in Japanese Patent Laying-Open No. 59-105779, for example.

Referring to these drawings, the interline transfer type solid-state image sensing device comprises a photosensitive, vertical charge transfer section 1, a horizontal charge transfer section 2, and overflow drain sections 3. The photosensitive, vertical transfer section 1 includes photoelectric conversion regions 4 and vertical charge transfer regions 5. The photoelectric conversion regions 4 include a plurality of n-type impurity regions 7 arranged in a matrix form on a main surface of a p-type silicon substrate 6.

The vertical charge transfer regions 5 include channel regions 8, insulating films 9 and transfer electrodes 10. The channel regions 8 comprise n-type impurity regions formed on the main surface of the p-type silicon substrate 6. The transfer electrodes 10 comprise a plurality of polysilicon conductive layers aligned in a direction of charge transfer.

A p+ impurity region 11 is formed between each n-type impurity region 7 of the photoelectric conversion regions 4 and each channel region 8 of the vertical charge transfer regions 5. The transfer electrodes 10 partly overlie the p+impurity regions 11 with the insulating films 9 in between. The p+impurity regions 11, extensions of the transfer electrodes 10 and insulating layers 9 constitute read gates 12.

The overflow drain sections 3 are opposed to the vertical charge transfer regions 5 across the photoelectric conversion regions 4. The overflow drain sections 3 include p+impurity regions 13 and n-type impurity regions 14 formed on the main surface of the p-type silicon substrate 6, and gate electrodes 14 formed on the insulating films 9. Each overflow drain section 3 has a construction of a MOS (metal oxide semiconductor) transistor having the n-type impurity region 7 of the photoelectric conversion region 4 acting as the source, the n-type impurity region 14 acting as the drain, and the p+ impurity region 13 acting as the channel.

Element isolating and insulating oxide films 16 are formed on selected regions of the main surface of the p-type silicon substrate 6. The element isolating and insulating oxide films 16 provide insulation and isolation between the vertical charge transfer regions 5 and overflow drain regions 3 lying adjacent to each other and between the aligned n-type impurity regions 7 of each photoelectric conversion region 4.

The horizontal charge transfer section 2 comprises a charge transfer CCD (charge coupled device).

The overflow drain sections 3 are connected to a purge drain 17. The purge drain 17 is formed in an opposite position to the horizontal charge transfer section 2.

An operation of the solid-state image sensing device will be described next with reference to FIGS. 12A and 12B. FIG. 12A is a schematic plan view of the solid-state image sensing device illustrating the operation thereof. FIG. 12B is a timing chart of the operation of the solid-state image sensing device. Referring to these drawings, the photoelectric conversion regions 4, which comprise a plurality of photodiodes, are connected respectively through the read gates 12 to the vertical charge transfer regions 5 aligned vertically. When light enters the photoelectric conversion regions 4, the photodiodes constituting the photoelectric conversion regions 4 become optically charged. The optical charges accumulate during a vertical blanking period. When gate pulses P2 are applied to the read gates 12, the charges are read to the vertical charge transfer regions 5 all at once. The optical charges thus read are transferred through the vertical charge transfer regions 5 to the horizontal charge transfer section 2. A signal corresponding to one line is taken out as a video signal output during each horizontal scan period. This function is termed electronic shutter function.

On the other hand, during a vertical effective scan period for transferring effective optical charges to the horizontal charge transfer section 2, superfluous charges are generated in the photoelectric conversion regions 4 by light continuously impinging thereon. The overflow drain structure is operable to purge these superfluous charges outwardly of the device. More particularly, gate pulses P1 of a predetermined voltage are applied to the gate electrodes 15 of the overflow drain sections 3 at predetermined intervals of time during the vertical effective scan period. As a result, the superfluous charges generated in the photoelectric conversion regions 4 are transferred to the purge drain 17 through the n-type impurity regions 14, and are then purged outwardly. In this way, a clear image may be reproduced by the shutter function which reads or purges effective optical charges and superfluous charges at predetermined time intervals.

The above example is a solid-state image sensing device including a flat type overflow drain structure having overflow drain sections 3 arranged parallel to the photoelectric conversion regions 4 on the main surface of the semiconductor substrate. This construction has the disadvantage that the presence of overflow drain sections 3 allows the photoelectric conversion regions to occupy a reduced proportion of the main surface of the semiconductor substrate or increases a required area of the main surface of the substrate. In view of the above situation, a device has been proposed which prevents the overflow drain structure from causing a substantial reduction in the area allocated to the photoelectric conversion regions and the like. This example will be described with reference to FIG. 13. FIG. 13 is a sectional view of a solid-state image sensing device having what is known as a vertical overflow drain structure. Such a structure is disclosed in Japanese Patent Laying-Open No. 63-27057, for example.

Referring to FIG. 13, this solid-state image sensing device comprises overflow drain sections 3, photoelectric conversion regions 4, vertical charge transfer regions 5 and read gates 12.

The illustrated device further comprises p-wells 19 of p-type impurity regions formed on a main surface of an n-type silicon substrate 18. Further, n-type impurity regions 7 are formed on surface regions of the p-wells 19. The regions having these n-type impurity regions 7 constitute the photoelectric conversion regions 4.

The vertical charge transfer regions 5 include channel regions 8 comprising n-type impurity regions formed on surfaces of the p-wells 19, and transfer electrodes 10 formed on an insulating film 9. The transfer electrodes 10 comprise a plurality of electrodes aligned in a direction of optical charge transfer.

The read gates 12 include gate electrodes 15 formed on the insulating film 9. Each gate electrode 15, insulating film 9 and n-type impurity region 7, and channel region 8 constitute a MOS transistor.

Each overflow drain section 3 is defined in a groove 21 formed in the main surface of the n-type silicon substrate 18. An insulating film 22 is formed on inside walls of each groove 21. Further, a gate electrode 23 is formed on a surface of the insulating film 22. This overflow drain section 3 defines a MOS transistor having the gate insulating film 22 and gate electrode 23, with the n-type impurity region 7 acting as a source region, and the n-type silicon substrate 18 acting as a drain region. A channel stop region 24 comprising a high-density p-type impurity region is formed on a side face of the groove 21 closer to the vertical charge transfer region 5.

An operation of the overflow drain sections 3 will be described next. Optical charges are generated in the n-type impurity regions 7 of the photoelectric conversion regions 4 by light impinging thereon. When superfluous charges are generated by intense incident light, a predetermined voltage is applied to the gate electrodes 23. As a result, inversion layers are formed on surfaces of the regions of the p-wells 19 opposed to the gate electrodes 23. The superfluous charges are purged to the n-type silicon substrate 18 through these inversion layers. The channel stop region 24 is formed on one side of the groove 21. Therefore, a channel is not formed on the side having the channel stop region 24 even when the predetermined voltage is applied to the gate electrodes 23. This operation performs the element isolating function.

The solid-state image sensing device having the vertical overflow drain structure is effective to reduce the surface area occupied by the overflow drain sections, compared with the solid-state image sensing device having the conventional flat type overflow drain structure.

As described above, the conventional solid-state image sensing devices have one overflow drain section for one photoelectric conversion region. The device has relied for its microminiaturization on a reduction in size of the overflow drain sections, but nothing has been achieved with respect to the arrangement of elements on the main surface of the semiconductor substrate.

SUMMARY OF THE INVENTION

An object of this invention is to promote microminiaturization of an element construction of a solid-state image sensing device having an overflow drain structure.

Another object of this invention is to provide an improvement in the opening ratio of a solid-state image sensing device having an overflow drain structure.

A further object of this invention is to realize a reduced surface occupying ratio of overflow drain regions of a solid-state image sensing device.

A still further object of this invention is to provide a method of manufacturing a solid-state image sensing device having a diminished overflow drain structure.

A solid-state image sensing device according to this invention has an overflow drain structure for purging superfluous charges generated when light exceeding a predetermined quantity impinges upon photoelectric conversion elements. The device comprises a semiconductor substrate of a first conduction type having a main surface and including grooves extending in a predetermined direction on the main surface, each of the grooves having opposite side surfaces spaced from each other and a bottom surface interconnecting the side surfaces. This solid-state image sensing device further comprises a first array of photoelectric conversion elements including a plurality of first impurity regions of a second conduction type formed on the main surface of the semiconductor substrate adjacent one of the side surfaces of each groove and aligned in a direction in which the grooves extend, a second array of photoelectric conversion elements including a plurality of second impurity regions of the second conduction type formed on the main surface of the semiconductor substrate adjacent the other side surface of each groove and aligned in the direction in which the grooves extend, channel regions formed on the respective side surfaces of each groove to be independent of each other, drain regions of the second conduction type each separated from the first impurity regions and the second impurity regions by each of the channel regions and contacting one of the side surfaces and the bottom surface of each groove, and gate electrodes each formed the channel regions and each of the drain regions through an insulating film.

The solid-state image sensing device of this invention includes grooves each formed between adjacent photoelectric conversion regions, and an overflow drain structure formed inside the groove. This construction allows the overflow drain regions to occupy a reduced proportion of the main surface of the solid-state image sensing device, compared with the conventional solid state image sensing device having one overflow drain structure for one photoelectric conversion region. Consequently, the element construction may be further miniaturized, and the solid-state image sensing device may have an increased opening ratio.

The overflow drain structure may be driven to perform the pixel isolating function, blooming checking function and electronic shutter function separately and properly by varying the voltage applied to the gate electrodes.

A method of manufacturing a solid-state image sensing device according to this invention comprises the following steps: forming first impurity regions of a first conduction type having a high density on predetermined regions of a main surface of a semiconductor substrate of the first conduction type; forming element isolating oxide films on surfaces of the first impurity regions; applying impurity ions of a second conduction type to the surface of the semiconductor substrate by using the element isolating oxide films as a mask, thereby forming second impurity regions constituting photoelectric conversion elements; removing the element isolating oxide films from selected positions of the semiconductor substrate; forming grooves in the first impurity regions from which the element isolating oxide films have been removed; forming third impurity regions of the second conduction type on opposite side walls and bottom walls of the grooves; forming insulating films on the opposite side walls and the bottom walls of the grooves; and forming conductive layers on surfaces of the insulating films.

In the method of manufacturing a solid-state image sensing device according to this invention, impurity regions may easily be formed with controlled densities and depths inside microscopic grooves by using oblique ion implantation or the like.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
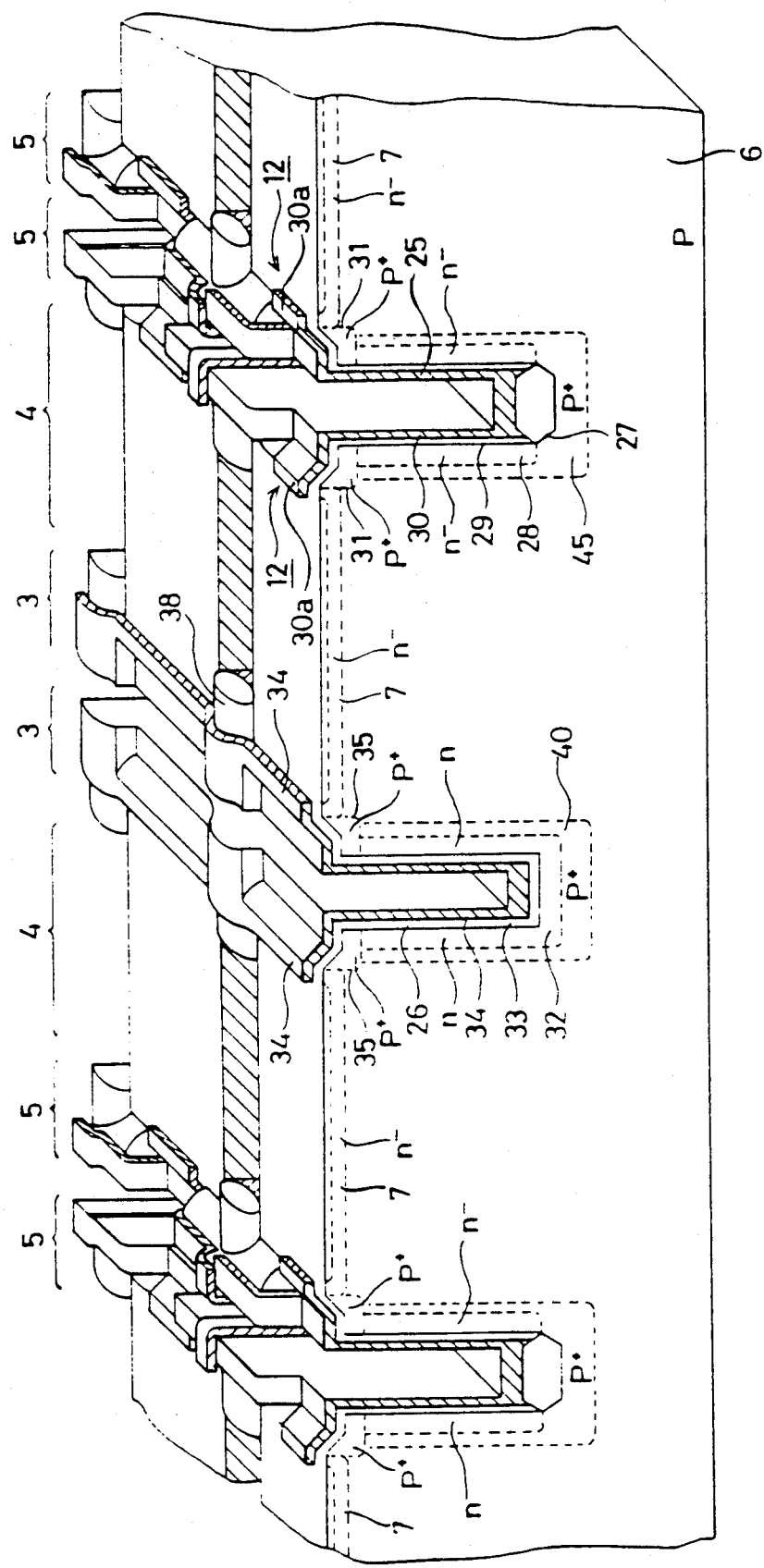
FIG. 1 is a sectional perspective view of a solid-state image sensing device in a first embodiment of this invention.
Figure 2:
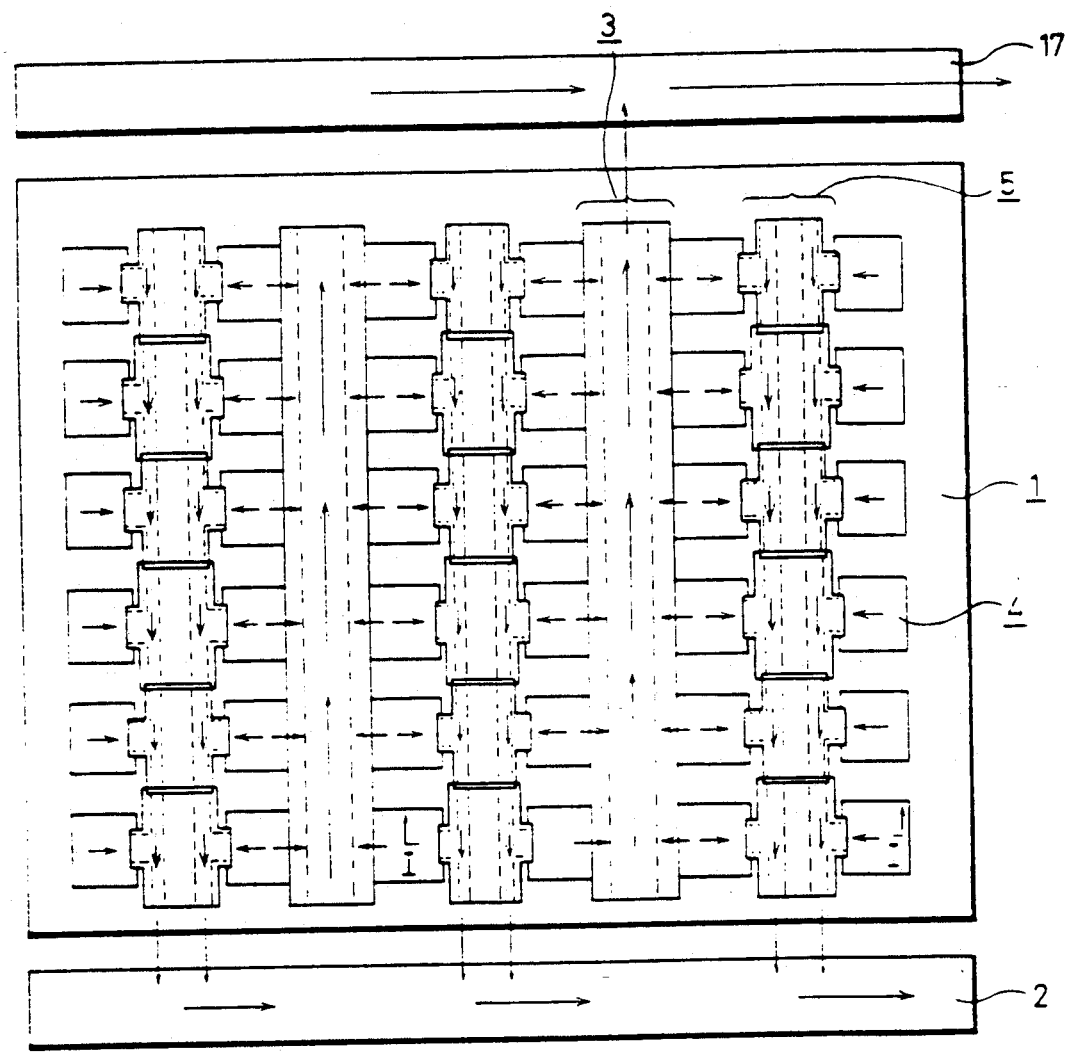
FIG. 2 is a plan view of the solid-state image sensing device shown in FIG. 1.

A first embodiment of this invention will be described in detail hereinafter with reference to the drawings. Referring to FIGS. 1 and 2, the illustrated solid-state image sensing device comprises a photosensitive, vertical charge transfer section 1, a horizontal charge transfer section 2, and a purge drain 17.

The photosensitive, vertical charge transfer section 1 includes overflow drain sections 3, photoelectric conversion regions 4, and vertical charge transfer regions 5.

Each photoelectric conversion region 4 includes a plurality of n-type impurity regions 7 aligned vertically (in the up and down direction in FIG. 2) on a main surface of a p-type silicon substrate 6. One n-type impurity region 7 corresponds to one pixel. A first groove 25 and a second groove 26 extend vertically along opposite sides of each vertical array of the photoelectric conversion regions 4 The vertical charge transfer regions 5 independent of each other are formed on opposite side walls of the first groove 25. The bottom of the first groove 25 is isolated and insulated by an element isolating and insulating film 27. Each vertical charge transfer region 5 includes an n— impurity region (channel region) 28 formed on one side wall of the first groove 25, an insulating film 29 formed on a surface of the n— impurity region 28, and transfer electrodes 30 formed on a surface of the insulating film 29. The plurality of transfer electrodes 30 are aligned along the first groove 25 to be independent of one another. The transfer electrodes 30 partly extend over the n-type impurity regions 7 of the photoelectric conversion regions 4, respectively. Extensions 30a of the transfer electrodes 30 act as read gates 12. P+ impurity regions 31 are formed at upper ends of the n— impurity regions 28. Further, a p+ impurity region 45 surrounds the n— impurity regions 28.

The overflow drain sections 3 are formed in the second groove 26. More particularly, a drain region 32 comprising an n-type impurity region is formed on opposite sides of the second groove 26. A gate electrode 34 is formed on inside walls of the second groove 26 on an insulating film 33. Further, channel regions 35 comprising p+ impurity regions are formed adjacent upper surfaces of the second groove 26. A MOS transistor structure is formed which includes the gate electrode 34, insulating film 33 and channel region 35, with the n-type impurity regions 7 of the photoelectric conversion regions 4 acting as source regions, and the drain region 32 acting as a drain region. The drain regions 32 of the overflow drain sections 3 are connected to the purge drain 17.

The manner in which the overflow drain sections of the solid-state image sensing device operate will be described next with reference to FIGS. 1 and 2. The overflow drain sections 3 of this embodiment perform three functions, i.e. an element isolating function, a blooming checking function and an electronic shutter function The element isolating function will be described first. Each overflow drain section 3 has the MOS transistor structure. The MOS transistor structure is a transistor structure that has adjacent n-type impurity regions 7 acting as source regions, and the drain region 32 acting as a drain region. Thus, this MOS transistor may constantly be maintained in an OFF state by applying an appropriate potential to the gate electrode 34. As a result, the adjacent n-type impurity regions 7 are insulated and isolated from each other.

The blooming checking function will be described next. When intense light enters the photoelectric conversion regions 4, excess charges are generated adjacent the n-type impurity regions 7. What is known as blooming phenomenon is caused by the excess charges mixing into the channel regions 28 of the vertical charge transfer regions 5. When superfluous charges are generated, they may be purged to the drain regions 32 by applying a predetermined potential to the gate electrodes 34 of the overflow drain sections 3 to turn on the MOS transistors. As a result, the superfluous charges are prevented from mixing into signal charges.

The electronic shutter function has already been described in relation to the prior art, and its description is not repeated here.

Figure 3:
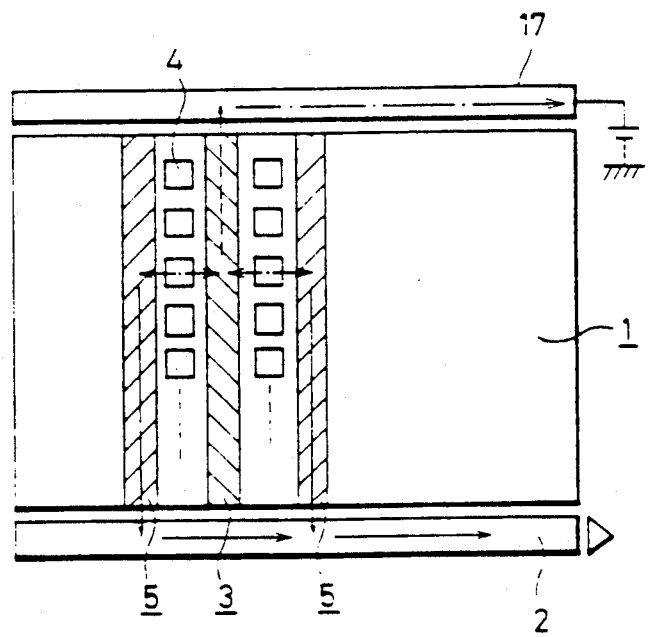
FIG. 3 is an explanatory view illustrating an operation of the solid-state image sensing device in the first embodiment of this invention.

FIG. 3 schematically shows the manner in which the signal charges and superfluous charges are transferred in the solid-state image sensing device. The signal charges are transferred, as indicated by solid lines in the drawing, from the photoelectric conversion regions 4 through the vertical charge transfer regions 5 to the horizontal charge transfer section 2. Thereafter, the signal charges are output externally by a transfer operation of the horizontal charge transfer section 2. The superfluous charges are transferred, as indicated by a dotted line, from the photoelectric conversion regions 4 through the overflow drain sections 3 to the purge drain 17. Thereafter, the superfluous charges are purged out through the purge drain 17.

Next, a method of manufacturing the solid-state image sensing device shown in FIGS. 1 and 2 will be described with reference to FIGS. 4A through 4G.

Figure 4A:
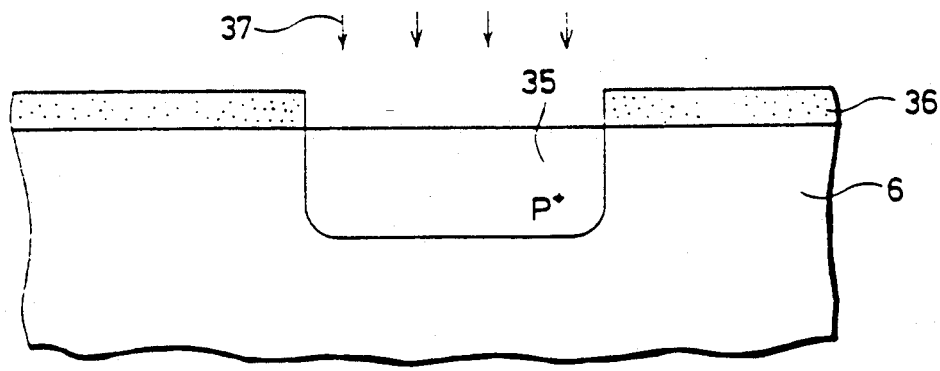
FIGS. 4A through 4G are sectional views illustrating a manufacturing sequence of the solid-state image sensing device in the first embodiment.

First, as shown in FIG. 4A, a resist pattern 36 having predetermined openings is formed on the main surface of the p-type silicon substrate 6. Next, p-type impurity ions 37 are applied by ion implantation to the surface of the p-type silicon substrate 6, using the resist pattern 36 as a mask. P+ impurity regions 35 are formed as a result of the ion implantation.

Figure 4B:
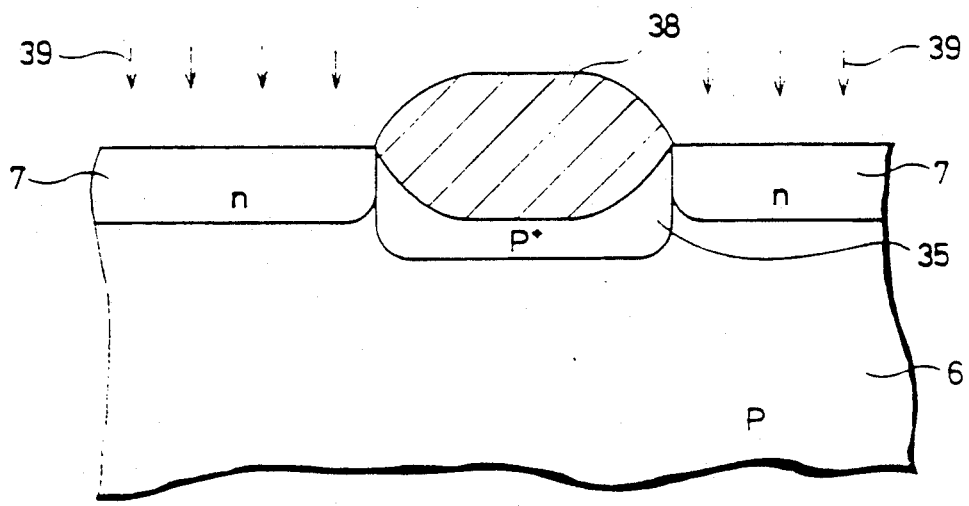

Next, as shown in FIG. 4B, a field isolating oxide film 38 is formed on the surface of each p+ impurity region 35 by using LOCOS (local oxidation of silicon). The field isolating oxide film 38 is used as a mask in implanting n-type impurity ions 39 into the surface of the p-type silicon substrate 6. This results in formation of the n-type impurity regions 7 of the photoelectric conversion regions 4.

Figure 4C:
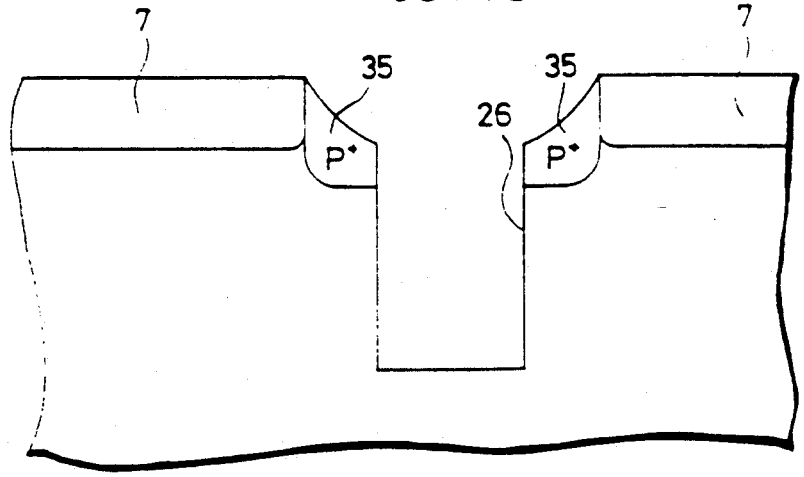

As shown in FIG. 4C, the field isolating oxide films 38 are etched away. Thereafter, the second grooves 26 are formed in positions from which the field isolating oxide films 38 have been removed.

Figure 4D:
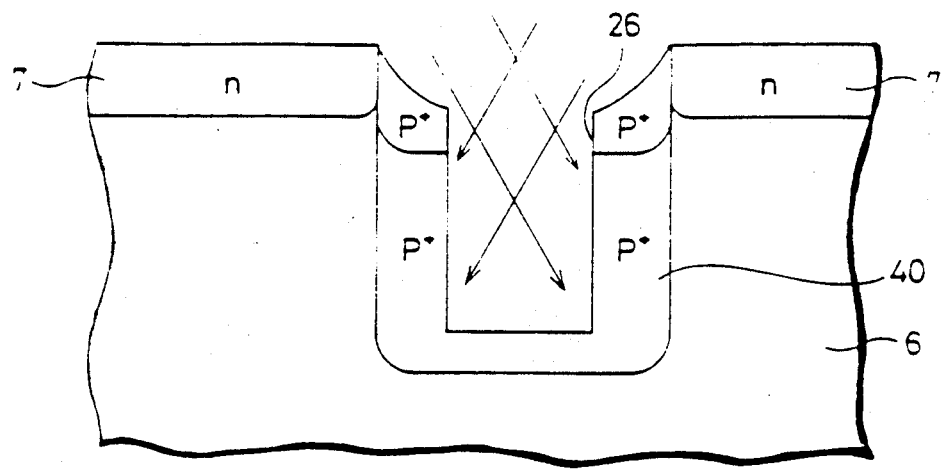

Further, as shown in FIG. 4D, the p+ impurity region 40 is formed on the inside walls of each of the second grooves 26 by oblique ion implantation.

Figure 4E:
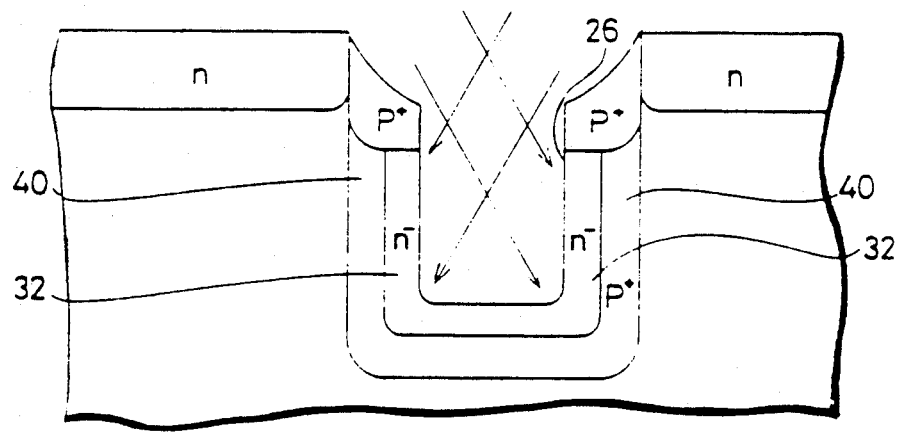

As shown in FIG. 4E, the n− impurity region 32 shallower than the p+ impurity region 40 is formed on the inside walls of each second groove 26 by a further oblique ion implantation process.

Figure 4F:
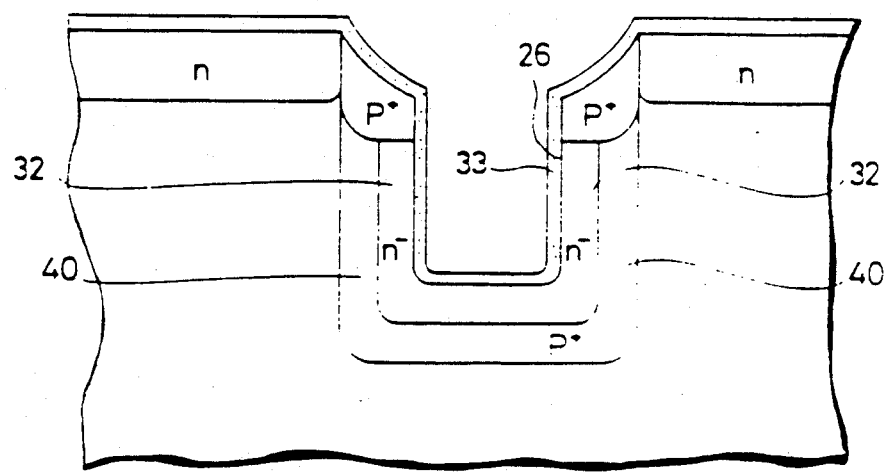

Next, as shown in FIG. 4F, the insulating film 33 is formed on the surface of the p-type silicon substrate 6 and inside walls of the second grooves 26 by using CVD (chemical vapor deposition).

Figure 4G:
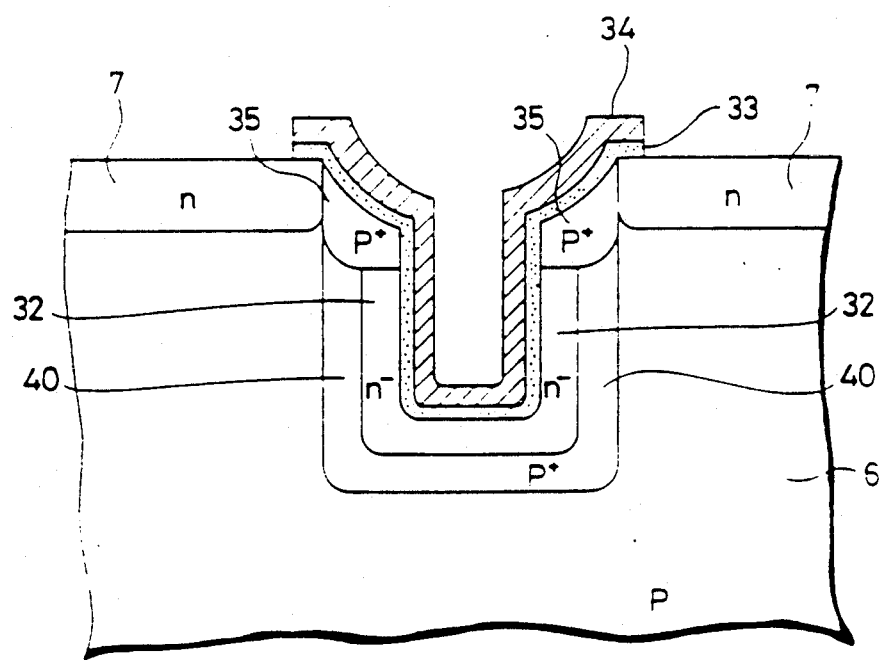

Finally, as shown in FIG. 4G, a polysilicon layer 34 is deposited on the surface of the insulating film 33 by CVD. Then the polysilicon layer 34 and insulating film 33 are shaped to predetermined patterns. This results in formation of the insulating film 33 and gate electrodes 34 of the overflow drain sections 3.

Figure 5:
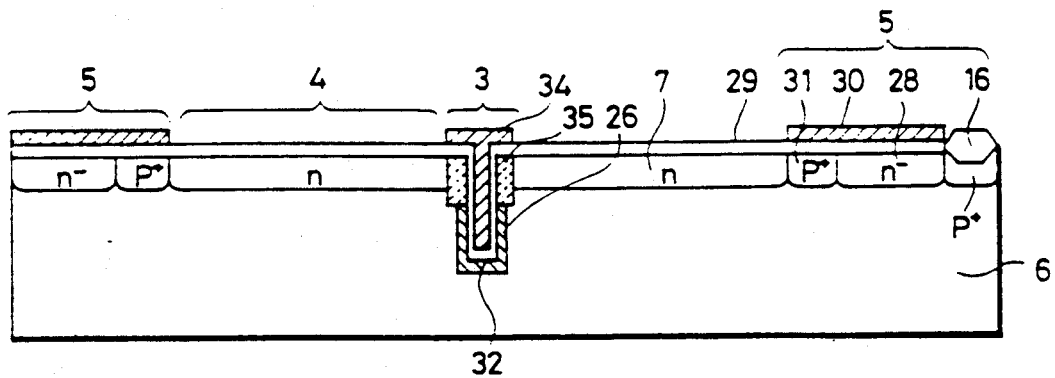
FIG. 5 is a sectional view of a solid-state image sensing device in a second embodiment of this invention.

A solid-state image sensing device according to a second embodiment of this invention will be described next with reference to FIG. 5. FIG. 5 is a sectional view of the solid-state image sensing device according to the second embodiment. As distinct from the first embodiment, the second embodiment has vertical charge transfer regions 5 formed on the main surface of a p-type silicon substrate 6. Overflow drain sections 3 are formed inside grooves 26 as in the first embodiment. Further, photoelectric conversion regions 4 are arranged along opposite sides of each overflow drain section 3.

As in the first embodiment, the overflow drain sections 3 have the three functions, i.e. the element isolating function, blooming checking function and electronic shutter function.

A method of manufacturing the solid-state image sensing device according to the second embodiment will be described next with reference to FIGS. 6A through 6E.

Figure 6A:
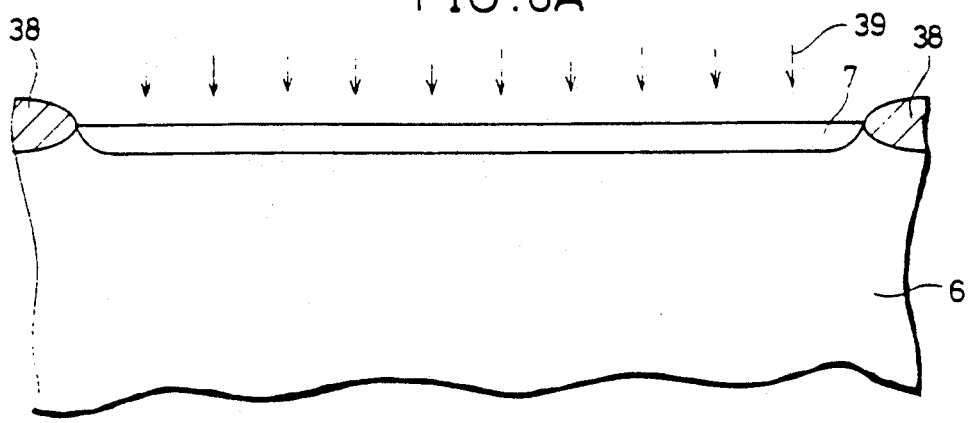
FIGS. 6A through 6E are sectional views illustrating a manufacturing sequence of the solid-state image sensing device shown in FIG. 5, FIGS. 7A through 7F are sectional views illustrating a different manufacturing sequence of the solid-state image sensing device shown in FIG. 5.

First, as shown in FIG. 6A, field isolating oxide films 38 are formed on predetermined regions of the surface of the p-type silicon substrate 6. Next, the field isolating oxide films 38 are used as a mask in implanting n-type impurity ions 39 into the surface of the p-type silicon substrate 6. N-type impurity regions 7 are formed as a result of the ion implantation.

Figure 6B:
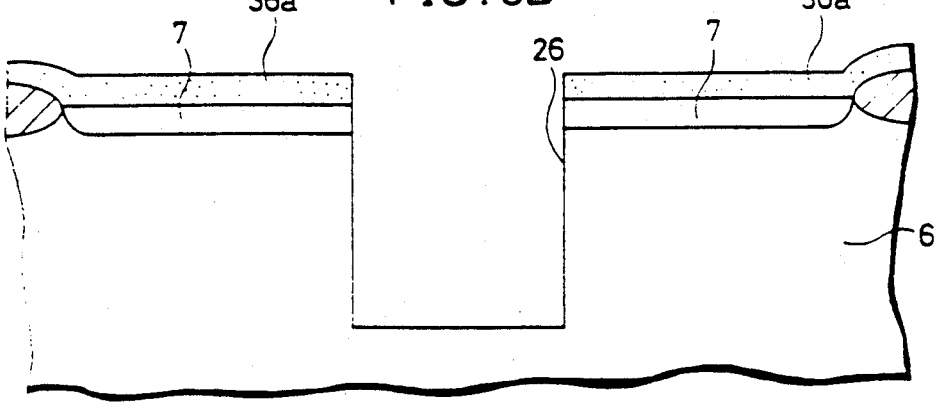

Next, as shown in FIG. 6B, a predetermined resist pattern 36a is formed on the surface of the p-type silicon substrate 6. The grooves 26 are formed in the p-type silicon substrate 6 by using the resist pattern 36a.

Figure 6C:
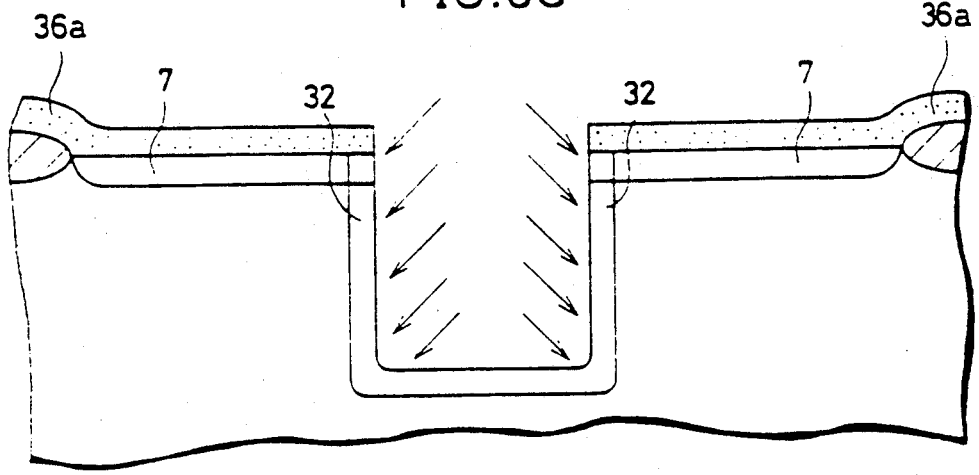

Further, as shown in FIG. 6C, the drain region 32 comprising the n-type impurity region is formed on inside walls of each groove 26 by oblique ion implantation.

Figure 6D:
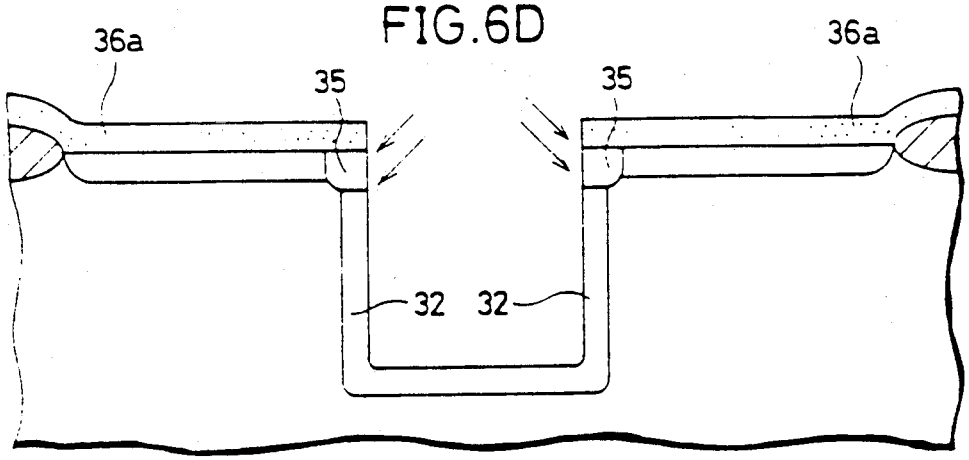

As shown in FIG. 6D, the p- impurity regions 35 are formed on upper surface regions of each groove 26 by a further oblique ion implantation process.

Figure 6E:
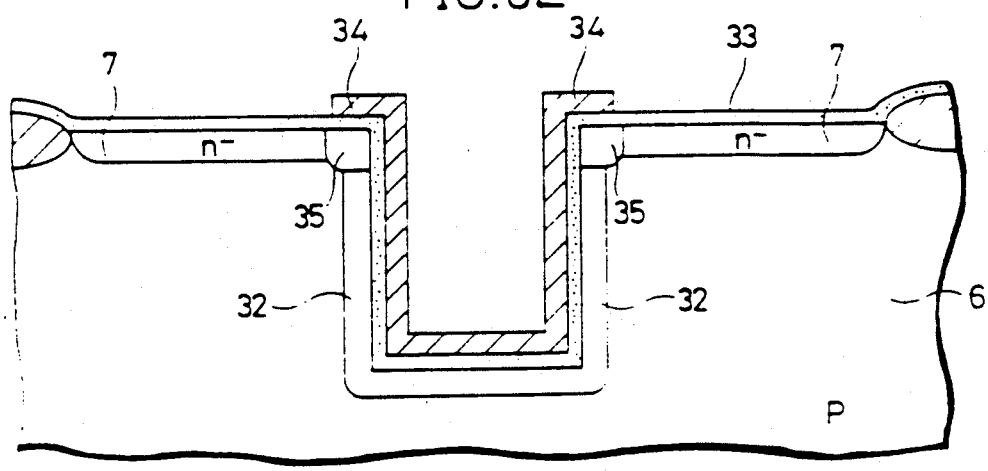

Subsequently, as shown in FIG. 6E, the resist pattern 36a is removed and then the insulating film 33 is deposited on the surface of the p-type silicon substrate 6 and inside walls of the grooves 26 by using CVD. Further, a polysilicon layer 34 is deposited on the surface of the insulating film 33 by CVD. Then the polysilicon layer 34 is shaped to a predetermined pattern, thereby forming the gate electrode 34.

The above process results in formation of the overflow drain sections 3 and photoelectric conversion regions 4.

Another method of manufacturing the solid-state image sensing device according to the second embodiment will be described next with reference to FIGS. 7A through 7F.

Figure 7A:
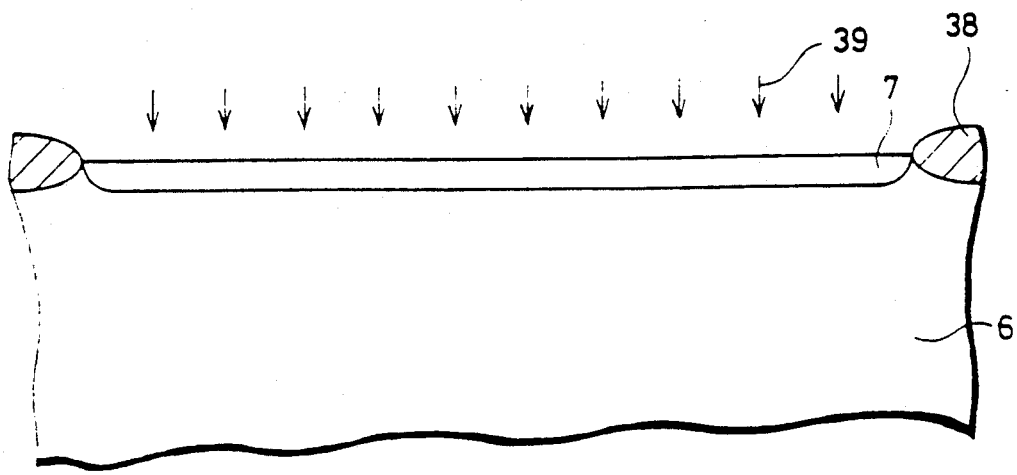

First, as shown in FIG. 7A, n-type impurity ions 39 are implanted into the surface of the p-type silicon substrate 6. As a result, the n-type impurity regions 7 are formed.

Figure 7B:
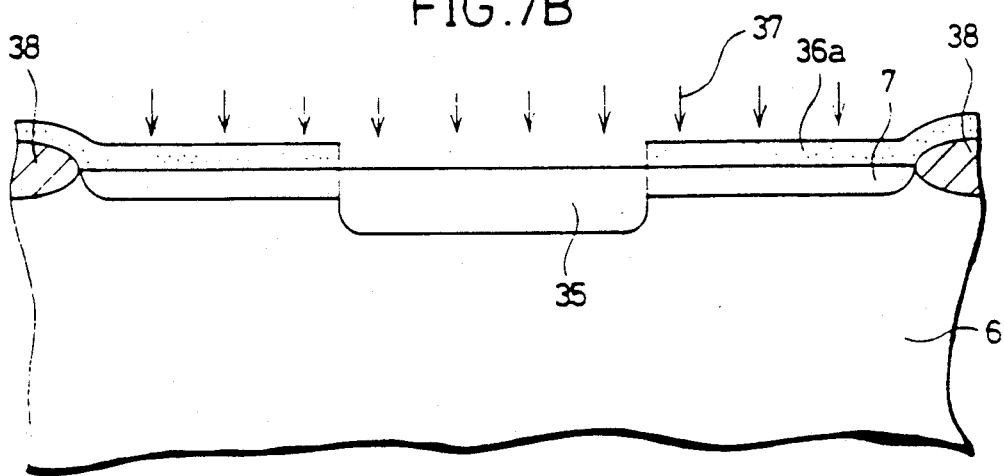

Next, as shown in FIG. 7B, a predetermined resist pattern 36a is formed on the surface of the p-type silicon substrate 6. Next, p-type impurity ions 37 are implanted into the surface of the p-type silicon substrate 6 by using the resist pattern 36a as a mask. This forms p+ impurity regions 35 on predetermined regions of the p-type silicon substrate 6.

Figure 7C:
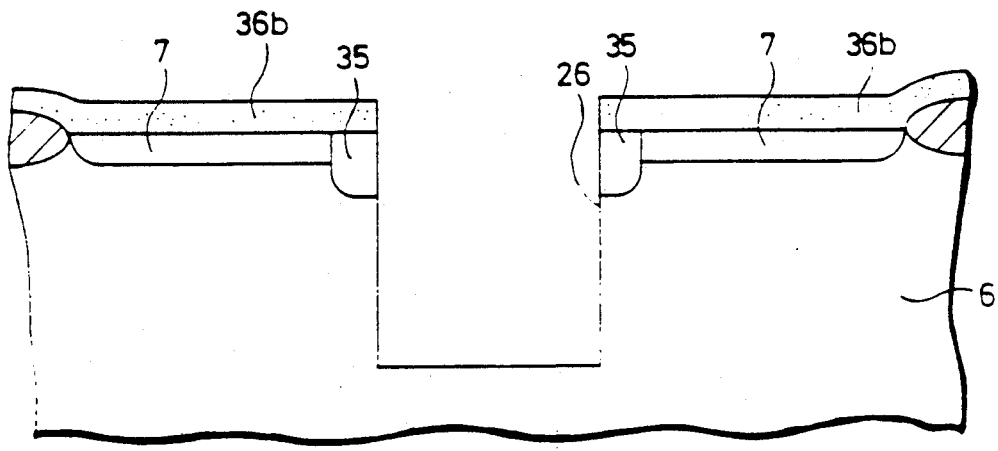

Further, as shown in FIG. 7C, the resist pattern 36a is removed and then a resist pattern 36b defining predetermined openings is formed again. The grooves 26 are formed in the p-type silicon substrate 6 by using this resist pattern 36b.

Figure 7D:
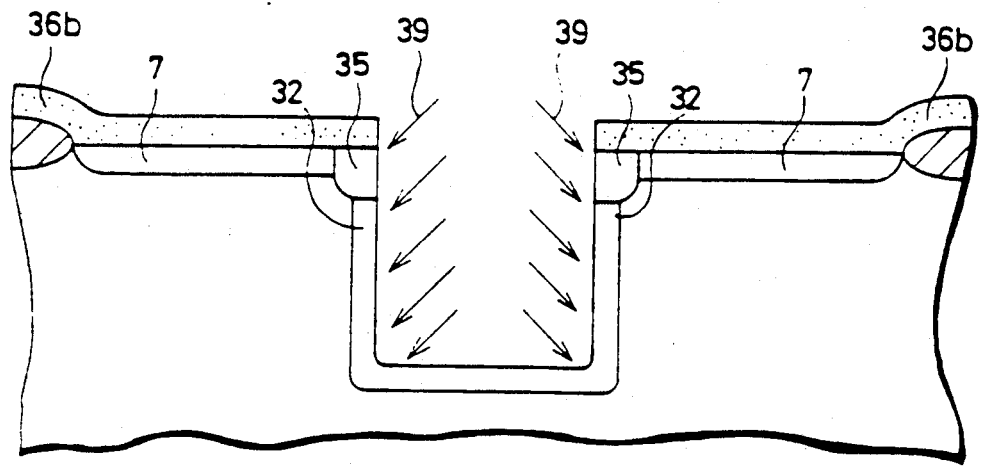

Further, as shown in FIG. 7D, n-type impurity ions 39 are implanted into the inside walls of each groove 26 by oblique ion implantation. The drain region 32 comprising the n-type impurity region is thereby formed along the inside walls of the groove 6.

Figure 7E:
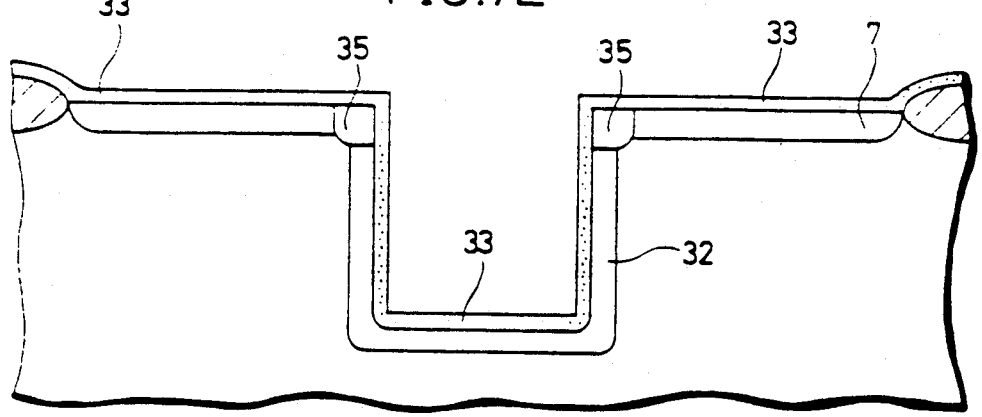

Subsequently, as shown in FIG. 7E, the resist pattern 36b is removed and then the insulating film 33 is formed on the surface of the p-type silicon substrate 6 and inside walls of the grooves 26 by using CVD.

Figure 7F:
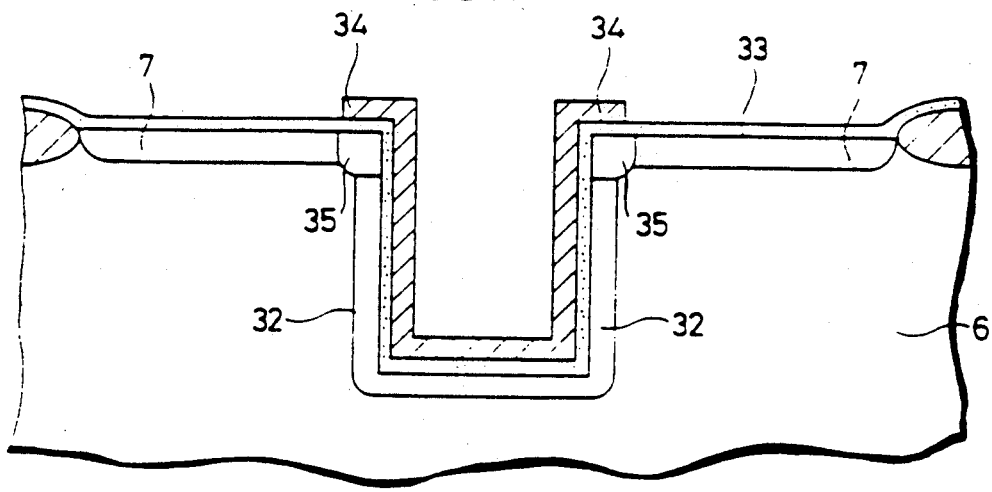

Further, as shown in FIG. 7F, a polysilicon layer 34 is deposited on the surface of the insulating film 33 by CVD. Then the polysilicon layer 34 is shaped to a predetermined pattern, thereby forming the gate electrode 34.

The above process results in formation of the overflow drain sections 3 and photoelectric conversion regions 4 of the solid-state image sensing device.

Figure 8:
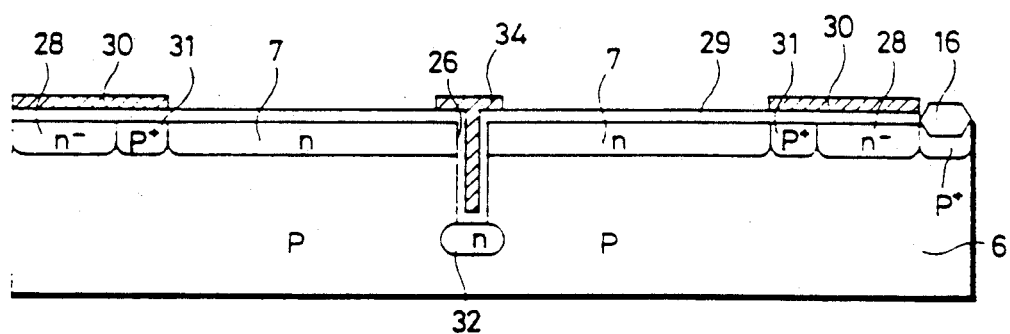
FIG. 8 is a sectional view of a solid-state image sensing device in a third embodiment of this invention.

A third embodiment of this invention will be described next. FIG. 8 is a sectional view of a solid-state image sensing device according to the third embodiment. This embodiment has a characterizing feature in the transistor structure of the overflow drain sections. More particularly, a high-density n-type impurity region is formed in the bottom of each groove 26. This high-density n-type impurity region acts as the drain region 32. Regions of the p-type silicon substrate 6 lying along the opposite sides of the groove 26 provide channel regions. With such a structure, a sufficient distance may be secured between the n-type impurity regions 7 of the photoelectric conversion regions 4 and the drain regions 32 of the overflow drains. It is thus possible to check leakage due to a punch-through phenomenon occurring therebetween. The drain regions 32 formed deep inside the p-type silicon substrate 6 serve as sinks for ions floating in the semiconductor substrate. This construction, therefore, is effective with respect to smear reduction also. The channel regions located laterally of the groove 26 are not affected by impurities introduced to control the threshold level of the MOS transistors constituting the overflow drain sections 3. Further, since the drain regions 32 comprise high-density impurity regions, their resistance may be reduced.

Figure 9:
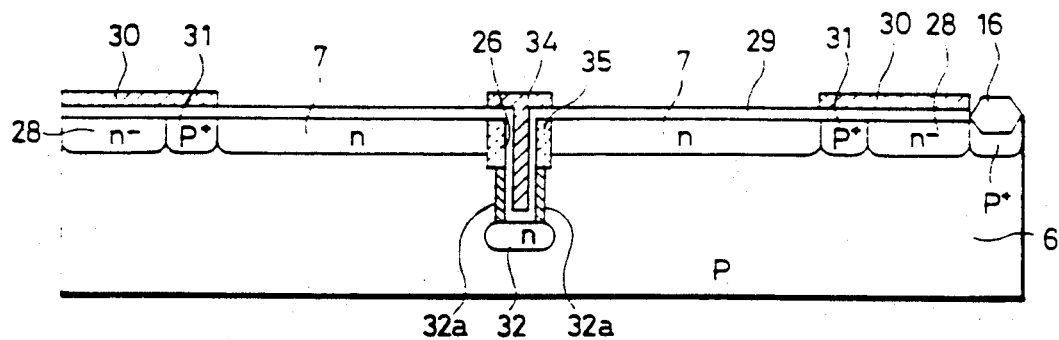
FIG. 9 is a sectional view of a solid-state image sensing device in a fourth embodiment of this invention.

A fourth embodiment of this invention will be described next. FIG. 9 is a sectional view of a solid-state image sensing device according to the fourth embodiment. This embodiment also has a characterizing feature in the transistor structure of the overflow drain sections. More particularly, control channels 35 comprising high-density p+impurity regions are formed on upper surfaces of each groove 26. Further, low-density overflow drains 32a comprising low-density n-type impurity regions are formed on opposite side walls of the groove 26 continuous with the control channels 35. A high-density overflow drain region 32b comprising a high-density n-type impurity region is formed in the bottom of each groove 26.

It is necessary for the overflow drains 32a on the side walls of the groove 26 to have a lower density than the control channels 35. However, with the low-density overflow drains 32a alone, it is difficult to transfer superfluous charges because of high resistance. Thus, superfluous charges are promptly purged through the high-density overflow drain region 32b formed in the bottom of the groove 26.

Figure 10:
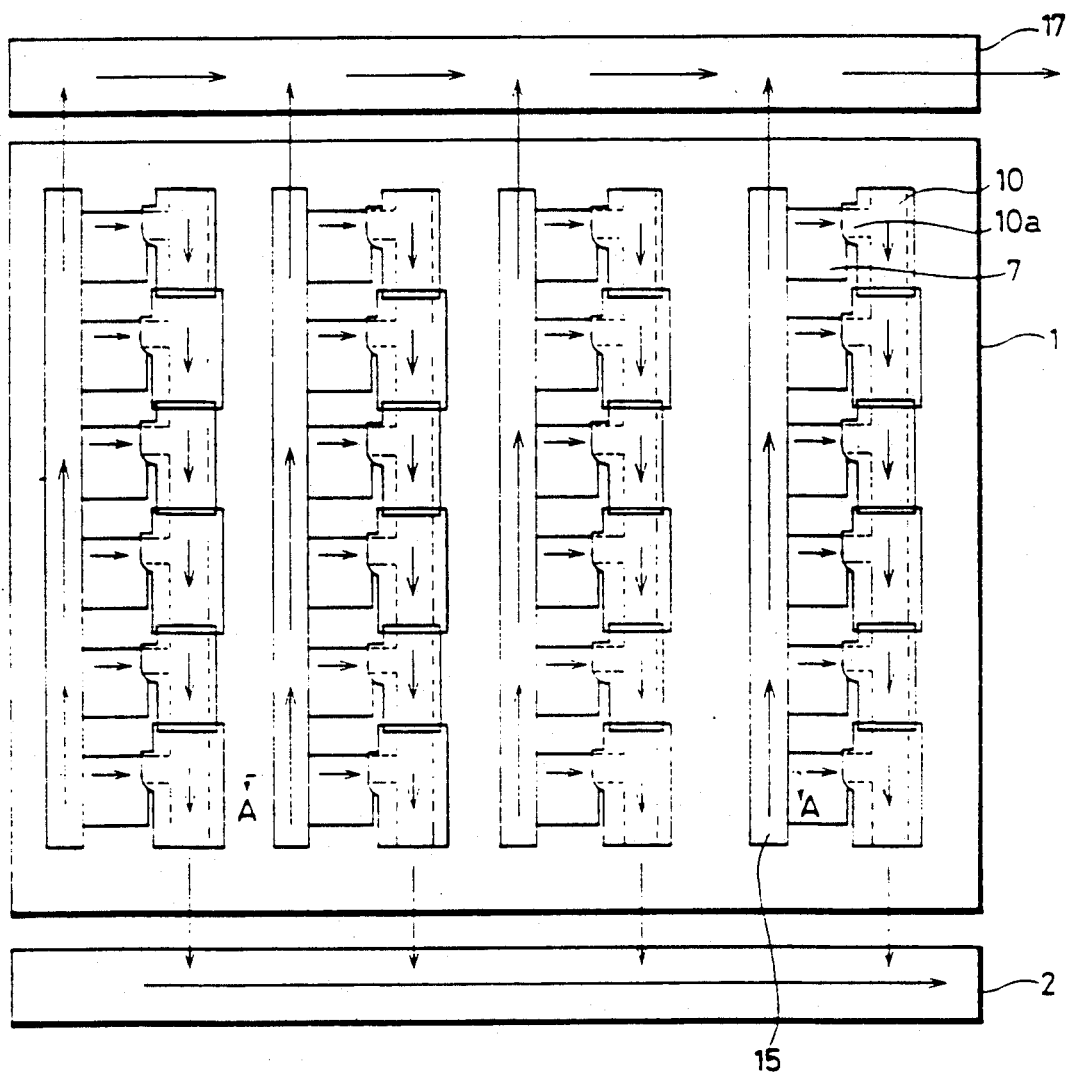
FIG. 10 is a plan view of a conventional solid-state image sensing device.
Figure 11:
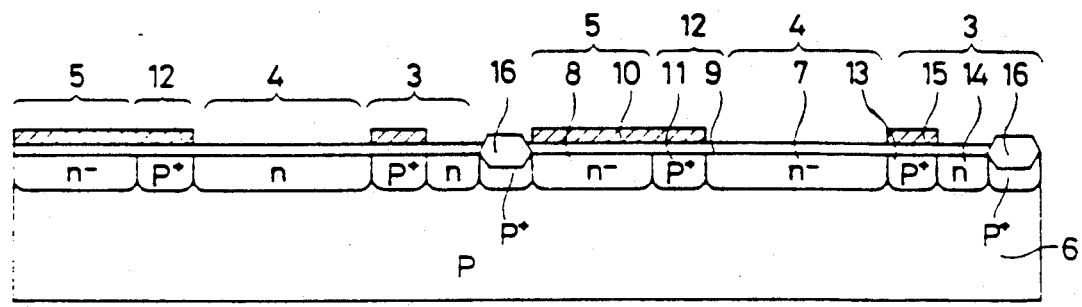
FIG. 11 is a sectional view of the solid-state image sensing device taken on line A—A of FIG. 10.
Figure 12A:
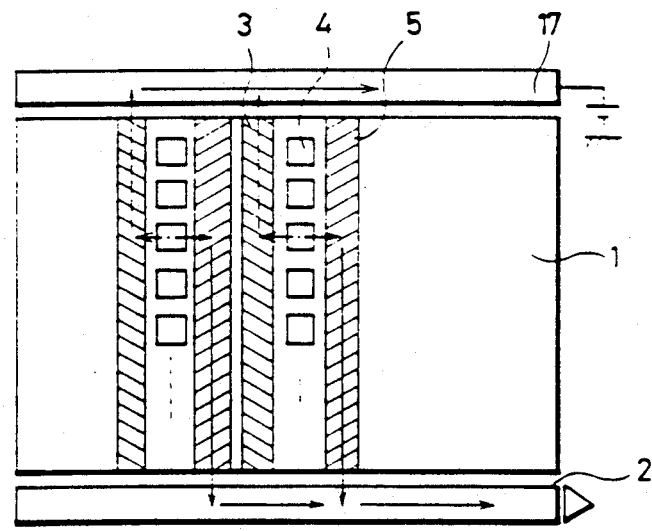
FIG. 12A is an explanatory view illustrating an operation of the conventional solid-state image sensing device shown in FIGS. 10 and 11.
Figure 12B:
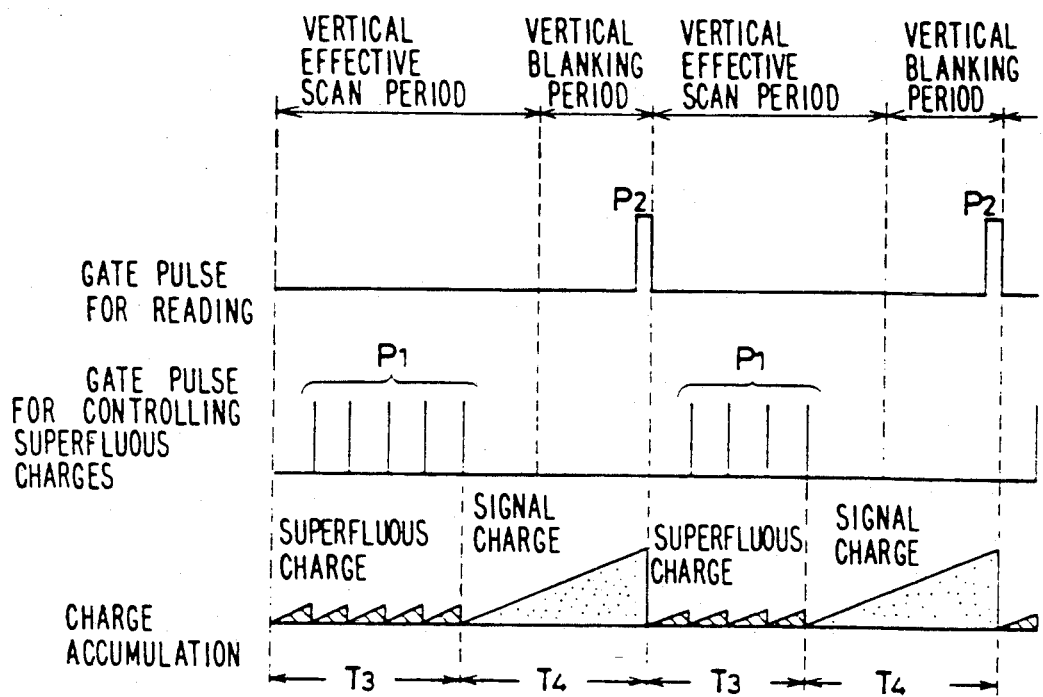
FIG. 12B is a timing chart illustrating the operation of the solid-state image sensing device shown in FIG. 12A.
Figure 13:
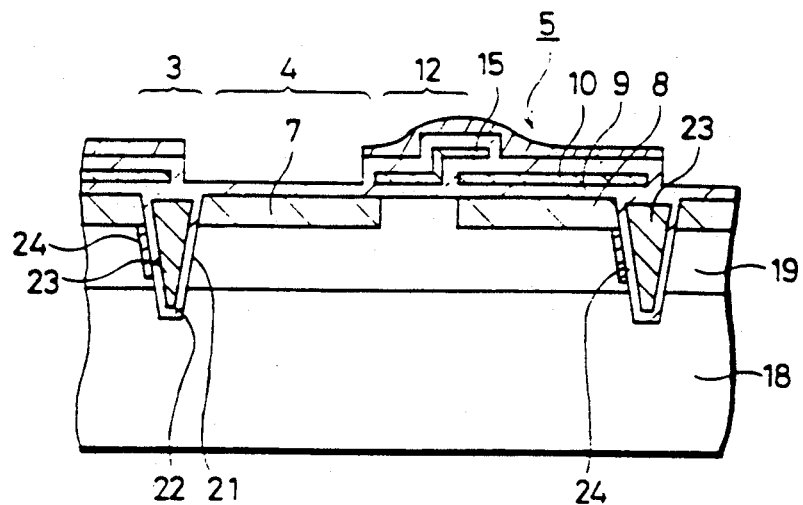
FIG. 13 is a sectional view of a different conventional solid-state image sensing device.

As described above, the solid-state image sensing devices according to this invention have a groove formed between adjacent photoelectric conversion regions, and an overflow drain section formed inside the groove. This construction allows the photoelectric conversion regions to occupy an increased proportion of the surface of the semiconductor substrate. Compared with the solid-state image sensing device having a flat type overflow drain structure as shown in FIGS. 10 and 11, for example, the solid-state image sensing devices according to this invention have the photoelectric conversion regions with a light-receiving area increased by about 1.7 times, and the opening ratio increased by about 31 to 52%. This assures an improvement in the sensitivity and dynamic range of the solid-state image sensing device.

In each of the foregoing embodiments, the solid-state image sensing device has been described as employing a p-type silicon substrate. This is not limitative, but the image sensing device may be formed on an n-type silicon substrate.

According to this invention, as described above, a groove is formed between adjacent photoelectric conversion regions, and an overflow drain structure is formed inside the groove. As a result, the photoelectric conversion regions have an enlarged light-receiving area, and the opening ratio of the solid-state image sensing device is improved. These features allow an improvement in the sensitivity and dynamic range of the device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a solid-state image sensing device having an overflow drain structure for purging superfluous charges generated when light exceeding a predetermined quantity enters optoelectro transducers, comprising the steps of:

forming first impurity regions (35) of a first conduction type having a high concentration on predetermined regions of a main surface of a semiconductor substrate of the first conduction type, forming element isolating oxide films (38) on surfaces of said first impurity regions, applying impurity ions (39) of a second conduction type to the surface of said semiconductor substrate by using said element isolating oxide films as a mask, thereby forming second impurity regions (7) constituting optoelectro transducer, removing said element isolating oxide films from selected positions of said semiconductor substrate, forming grooves (26) in said first impurity regions (7) from which said element isolating oxide films have been removed, forming third impurity regions (32) of the second conduction type on opposite side walls and bottom walls of said grooves, forming insulating films (33) on the opposite side walls and the bottom walls of said grooves, and forming conductive layers (34) on surfaces of said insulating films.

2. A method of manufacturing a solid-state image sensing device having an overflow drain structure for purging superfluous charges generated when light exceeding a predetermined quantity enters optoelectro transducers, comprising the steps of:
- forming, on a main surface of a semiconductor substrate, impurity regions (7) of a different conduction type to said semiconductor substrate,
- forming grooves (26) in predetermined regions of the main surface of said semiconductor substrate,
- forming drain regions (32) of a second conduction type, each extending continuously, on opposite side walls and bottom walls of said grooves by oblique ion implantation,
- forming channel regions (35) of the second conduction type having a higher concentration than said semiconductor substrate on upper positions of the side walls of said grooves by oblique ion implantation,
- forming insulating films (33) on the main surface of said semiconductor substrate and the opposite side walls and the bottom walls of said grooves, and
- forming conductive layers (34) on surfaces of said insulating films.

3. A method of manufacturing a solid-state image sensing device having an overflow drain structure for purging superfluous charges generated when light exceeding a predetermined quantity enters optoelectro transducers, comprising the steps of:
- forming, on a main surface of a semiconductor substrate, first impurity regions (7) of a different conduction type to said semiconductor substrate,
- forming, on predetermined regions of the main surface of said semiconductor substrate, impurity regions (35) of a first conduction type which is the same as said semiconductor substrate and having a higher concentration than said semiconductor substrate,
- forming grooves (26) in regions of the main surface of said semiconductor substrate on which said first impurity regions have been formed,
- forming drain regions (32) of a second conduction type,
- each extending continuously, on opposite side walls and bottom walls of said grooves by oblique ion implantation,
- forming insulating films (33) on the main surface of said semiconductor substrate and the opposite side walls and the bottom walls of said grooves, and
- forming conductive layers (34) on surfaces of said insulating films.

* * * * *